United States Patent
Yoshida

(10) Patent No.: US 7,705,469 B2
(45) Date of Patent: Apr. 27, 2010

(54) LEAD FRAME, SEMICONDUCTOR DEVICE USING SAME AND MANUFACTURING METHOD THEREOF

(75) Inventor: Yuichi Yoshida, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/081,535

(22) Filed: Apr. 17, 2008

(65) Prior Publication Data

US 2008/0315381 A1  Dec. 25, 2008

(30) Foreign Application Priority Data

May 31, 2007  (JP) ............................. 2007-145651

(51) Int. Cl.
*H01L 23/02* (2006.01)
*H01L 23/495* (2006.01)

(52) U.S. Cl. ...................... 257/777; 257/670; 257/676; 257/685; 257/686; 257/787; 257/780; 257/782; 257/784; 257/E25.006; 257/E25.021; 257/E25.027; 257/E23.037; 257/E23.039; 257/E23.085; 438/109; 438/123; 438/124

(58) Field of Classification Search ......... 257/666–677, 257/685, 686, 723, 777, E25.006, E25.021, 257/E25.027, E23.086, E23.031–E23.059; 438/109, FOR. 368, FOR. 426

See application file for complete search history.

(56) References Cited

U.S. PATENT DOCUMENTS

| 6,087,715 A | * | 7/2000 | Sawada et al. | ............. 257/666 |
| 6,316,838 B1 | * | 11/2001 | Ozawa et al. | ............. 257/778 |
| 2006/0232288 A1 | | 10/2006 | Okane et al. | |

FOREIGN PATENT DOCUMENTS

| JP | 6-21317 | * | 1/1994 | ............. 257/676 |
| JP | 2001-007277 | | 1/2001 | |
| JP | 2006-294795 | | 10/2006 | |

* cited by examiner

*Primary Examiner*—Jasmine J Clark
(74) *Attorney, Agent, or Firm*—Rabin & Berdo, PC

(57) ABSTRACT

The present invention provides a semiconductor device which comprises a lead frame including a die pad having one or two or more openings, a substrate mounted over the die pad so as to expose a plurality of semiconductor chip connecting second electrode pads from the openings of the die pad, a plurality of semiconductor chips mounted over the die pad and the substrate, bonding wires that connect chip electrode pads of the semiconductor chip and their corresponding semiconductor chip connecting first and second electrode pads of the substrate, and a sealing portion which covers these and is provided so as to expose parts of leads.

12 Claims, 8 Drawing Sheets

LEAD FRAME, SEMICONDUCTOR DEVICE USING SAME AND MANUFACTURING METHOD THEREOF

BACKGROUND OF THE INVENTION

The present invention relates to a lead frame and a semiconductor device using the lead frame, and particularly to a multichip package in which a plurality of semiconductor chips mounted on a die pad are sealed, and a manufacturing method thereof.

As to a semiconductor device, i.e., a package in which semiconductor chips are sealed, various package forms have been proposed.

As one of such package forms, there is known a lead frame, i.e., a so-called a multichip package using a lead frame.

As one example of the multichip package using the lead frame, there has been known a multichip package equipped with a lead frame having a die pad, a plurality of first bonding pads electrically connected to bonding pads of plural chips respectively, a plurality of second bonding pads and a signal position converter fixed to the die pad (refer to a patent document 1 (Japanese Laid-open Patent Application No. 2001-007277)).

In the present multichip package, the first bonding pads and leads of the lead frame are respectively electrically connected to one another via internally wired conductive wires in a one-to-one correspondence.

Further, the second bonding pads and the leads of the lead frame are respectively electrically connected to one another by wire bonding.

As another example of the multichip package using the lead frame, there has been known a multichip package including a plurality of bare chips stacked on at least one of opposed first and second main surfaces of a substrate, a spacer disposed between the two bare chips of these bare chips, which are positioned adjacent to each other vertically, and inner leads which are disposed on both sides in the horizontal direction with the substrate interposed therebetween and connected to their corresponding pads of each bare chip by bonding wires (refer to a patent document 2 (Japanese Laid-open Patent Application No. 2006-294795)).

In the present multichip package, the bonding wires which connect the pads of the bare chip on one end side of the spacer to their corresponding inner leads are disposed so as not to contact the bare chip on the other end side of the same spacer.

The conventional package referred to above always requires higher performance, higher functionality and higher-density packaging.

In the conventional multichip package having the above-described configuration, the mounting of the substrate onto the die pad is performed by ensuring a closed circular bonding or adhesion area having a width of about 2 mm at a peripheral end edge of a substrate mounting area of the die pad, applying an arbitrary and suitable adhesive or bonding material known to date to the bonding area and bonding them to each other.

A multichip package in which a storage type semiconductor chip like, for example, a flash memory chip is sealed in plural form, has been disclosed in the patent document 2 referred to above.

There are often instances where a further increase in capacity is required for the multichip package with the storage type semiconductor chips encapsulated therein in particular.

In such a case, the outer size of each sealed semiconductor chip is often made larger. In order to accommodate such an upsized semiconductor chip, there is a need to realize a further increase in the capacity of the multichip package. There is a case in which there is a need to cause a package size to remain unchanged upon the increase in the capacity of the multichip package.

In order to realize such a need with respect to the configuration disclosed by the patent document 1, for example, there is a need to expand the exclusively-possessed area of each opening at the die pad greater.

When, however, one attempts to make the exclusively-possessed area of the opening greater at the die pad's configuration disclosed in the patent document 1, the following problems might occur.

That is, it is difficult to ensure a bonding or adhesion area required to bond the die pad and the substrate to each other at the die pad. Since the strength of junction between the die pad and the substrate mounted thereto falls short as a result thereof, there is a fear that the reliability of the package is impaired.

In order to ensure the adhesion area, there is a need to make the exclusively-possessed area of the entire die pad greater. As a result, the volume of a sealing portion must be more increased. That is, a further increase in the size of the entire package is unavoidable in this case.

Further, since the strength of the die pad per se falls short when the exclusively-possessed area of each opening is enlarged without expanding the flat or planar size of the die pad, there is a fear that distortion and deformation occur in the lead frame at a package manufacturing process in particular. As a result, unexpected deformation occurs in, for example, a form of bonding between the die pad and the substrate, a form of bonding between each semiconductor chip and the substrate and the connection of each bonding wire. Hence, there is a fear that factors for the reliability of the package, such as the strength of the package and its electric characteristics are impaired.

SUMMARY OF THE INVENTION

The present invention has been made in view of the problems of the related arts. It is therefore an object of the present invention to provide a lead frame having a die pad which makes it possible to mount a plurality of semiconductor chips each larger in outer size, particularly, planar size where an upper surface of a package is viewed and to seal the same without scaling up the size of the entire package, a semiconductor device using the lead frame, and a manufacturing method thereof.

In order to solve the above problems, the lead frame of the present invention has the following constructional features.

The lead frame has a die pad provided as its constituent part. The die pad has a first main surface and a second main surface opposite to the first main surface. A substrate mounting area is set to the first main surface. A die pad-side semiconductor chip mounting area is set to the second main surface.

The die pad has one or two or more openings provided so as to penetrate between the first main surface and the second main surface within the substrate mounting area and outside the die pad-side semiconductor chip mounting area.

A semiconductor device of the present invention includes the following constituent elements.

The semiconductor device includes a lead frame. The lead frame has a die pad and a plurality of leads that extend in the direction in which one ends thereof are directed toward end edges of the die pad and that are provided so as to surround the die pad. The die pad has a first main surface provided with a substrate mounting area and a second main surface provided opposite to the first main surface and to which a die pad-side semiconductor chip mounting area is set, and one or two or more openings provided to penetrate between the first main surface and the second main surface within the substrate mounting area and outside the die pad-side semiconductor chip mounting area.

The semiconductor device includes a substrate. The substrate has a first main surface and a second main surface opposite to the first main surface. A substrate-side semiconductor chip mounting area is set to the first main surface, and a plurality of semiconductor chip connecting first electrode pads are provided outside the substrate-side semiconductor chip mounting area. The second main surface of the substrate is mounted opposite to the substrate mounting area of the lead frame. A plurality of semiconductor chip connecting second electrode pads exposed from the openings of the die pad are provided in the second main surface. A plurality of lead connecting electrode pads are provided in the area of the first main surface, which is located outside the substrate-side semiconductor chip mounting area.

Further, the semiconductor device includes a first semiconductor chip. The first semiconductor chip has a surface and a back surface opposite to the surface and is mounted in the die pad-side semiconductor chip mounting area with the back surface being opposed thereto. In addition, the first semiconductor chip has a plurality of chip electrode pads provided on the surface side.

Besides, first bonding wires connect the semiconductor chip connecting second electrode pads and the chip electrode pads of the first semiconductor chip to one another.

Still further, the semiconductor device includes a second semiconductor chip. The second semiconductor chip has a surface and a back surface opposite to the surface and is mounted in the substrate-side semiconductor chip mounting area with the back surface being opposed thereto. The second semiconductor chip also has a plurality of chip electrode pads provided on the surface side.

Second bonding wires connect the semiconductor chip connecting first electrode pads and the chip electrode pads of the second semiconductor chip to one another.

Third bonding wires connect the lead connecting electrode pads and the leads to one another.

The semiconductor device is also equipped with a sealing or encapsulating portion. The sealing portion covers the die pad, the substrate, the first semiconductor chip, the second semiconductor chip, the first bonding wires, the second bonding wires and the third bonding wires and is provided so as to expose parts of the leads.

A method for manufacturing a semiconductor device of the present invention includes the following steps (1) through (9).

(1) A lead frame is first prepared. The lead frame includes a base material provided with a device hole; a die pad that is suspended by support leads within the device hole and has a first main surface to which a substrate mounting area is set and a second main surface provided opposite to the first main surface and to which a die pad-side semiconductor chip mounting area is set, and that has one or two or more openings provided to penetrate between the first main surface and the second main surface within the substrate mounting area and outside the die pad-side semiconductor chip mounting area; and a plurality of leads which protrude within the device hole in a direction in which one ends thereof are directed toward edge edges of the die pad and which are provided such that other ends thereof extend over the base material.

(2) Next, a substrate is mounted in the substrate mounting area of the lead frame such that a plurality of semiconductor chip connecting second electrode pads are exposed from the openings of the die pad. The substrate has a first main surface to which a substrate-side semiconductor chip mounting area is set and which is provided with a plurality of semiconductor chip connecting first electrode pads outside the substrate-side semiconductor chip mounting area, and a second main surface opposite to the first main surface and provided with the semiconductor chip connecting second electrode pads. The substrate has a plurality of lead connecting electrode pads provided in the first main surface that falls outside the substrate-side semiconductor chip mounting area.

(3) A first semiconductor chip having a surface and a back surface opposite to the surface and having a plurality of chip electrode pads provided on the surface side is mounted with the back surface being opposed to the die pad-side semiconductor chip mounting area.

(4) First bonding wires that connect the semiconductor chip connecting second electrode pads and the chip electrode pads of the first semiconductor chip are provided.

(5) A second semiconductor chip having a surface and a back surface opposite to the surface and having a plurality of chip electrode pads provided on the surface side is mounted with the back surface being opposed to the substrate-side semiconductor chip mounting area.

(6) Second bonding wires which connect the semiconductor chip connecting first electrode pads and the chip electrode pads of the second semiconductor chip are provided.

(7) Third bonding wires which connect the lead connecting electrode pads and the leads are provided.

(8) A sealing portion which covers the die pad, the substrate, the first semiconductor chip, the second semiconductor chip, the first bonding wires, the second bonding wires and the third bonding wires and exposes parts of the leads, is formed.

(9) The leads and the support leads lying within the device hole are cut to provide individualization.

According to the configuration of the semiconductor device of the present invention, a substrate and semiconductor chips are mounted on a die pad having one or two or more openings that expose only a plurality of electrode pads provided in the mounted substrate within a substrate mounting area on the first main surface side and outside a die pad-side semiconductor chip mounting area on the second main surface side. Thus, each semiconductor chip larger in planar size is sealed without enlarging a package size, and the semiconductor device can be brought into higher-performance form.

Since the area of each opening of the lead frame according to the present invention is reduced to a minimum breadth that makes it possible to expose the plural electrode pads of the substrate at each opening, the area of the die pad-side semiconductor chip mounting area is more expanded by the reduction in the area, thereby making it possible to increase the rate of the die pad-side semiconductor chip mounting area to the full area of the die pad. Thus, each semiconductor chip larger in planar size can be sealed while the strength of the die pad is being ensured. As a result, it is possible to enlarge the reliability of the semiconductor device and achieve higher functionality and higher performance.

Upon manufacturing the semiconductor device of the present invention, the semiconductor device of the present invention, having the already-described configuration can be manufactured more efficiently if the manufacturing method including the aforementioned steps is implemented.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1A:
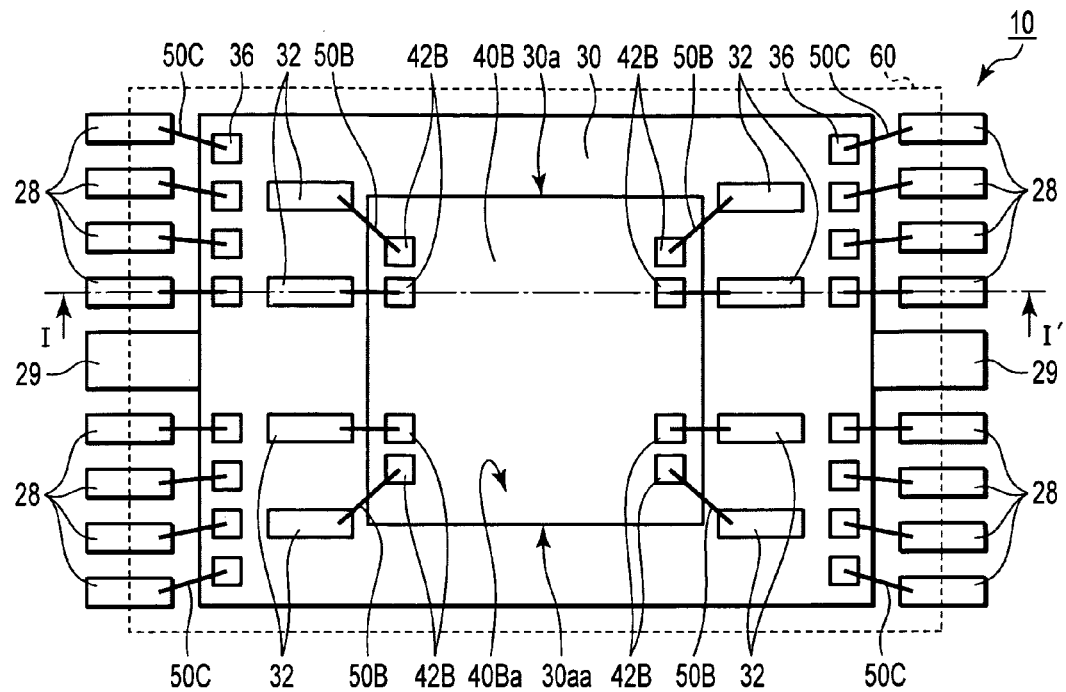
FIG. 1(A) is a schematic plan view of a semiconductor device of the present invention as viewed from the upper side thereof.

Preferred embodiments of the present invention will hereinafter be described with reference to the accompanying drawings. Incidentally, the shape, size and physical relationship of each constituent element in the accompanying drawings are merely approximate illustrations to enable an understanding of the present invention. The present invention is not limited by it in particular. Similar constituent elements illustrated in the respective figures used in the following description are given the same reference numerals, and their dual explanations might be omitted.

First Preferred Embodiment (1) Configuration Example of Semiconductor Device A configuration example of a semiconductor device of the present invention will be explained with reference to FIGS. 1 and 2.

Figure 1B:
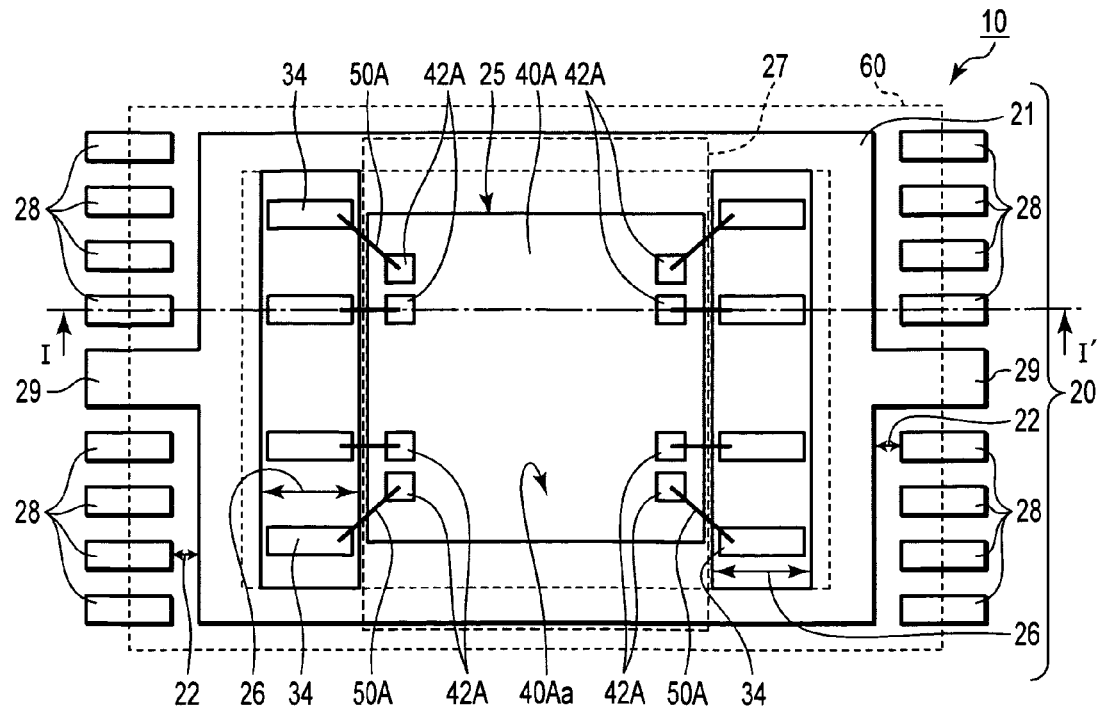
FIG. 1(B) is a schematic plan view thereof as viewed from the lower side thereof.

FIG. 1(A) is a schematic plan view of the semiconductor device of the present invention as viewed from the upper side thereof, and FIG. 1(B) is a schematic plan view thereof as viewed from the lower side thereof.

Incidentally, an schematic representation of an encapsulating or sealing portion that constitutes the outermost layer of the present semiconductor device is omitted to make it easier to understand constituent elements lying within the sealing portion. Only its outline or contour is shown by a dotted line.

Figure 2:
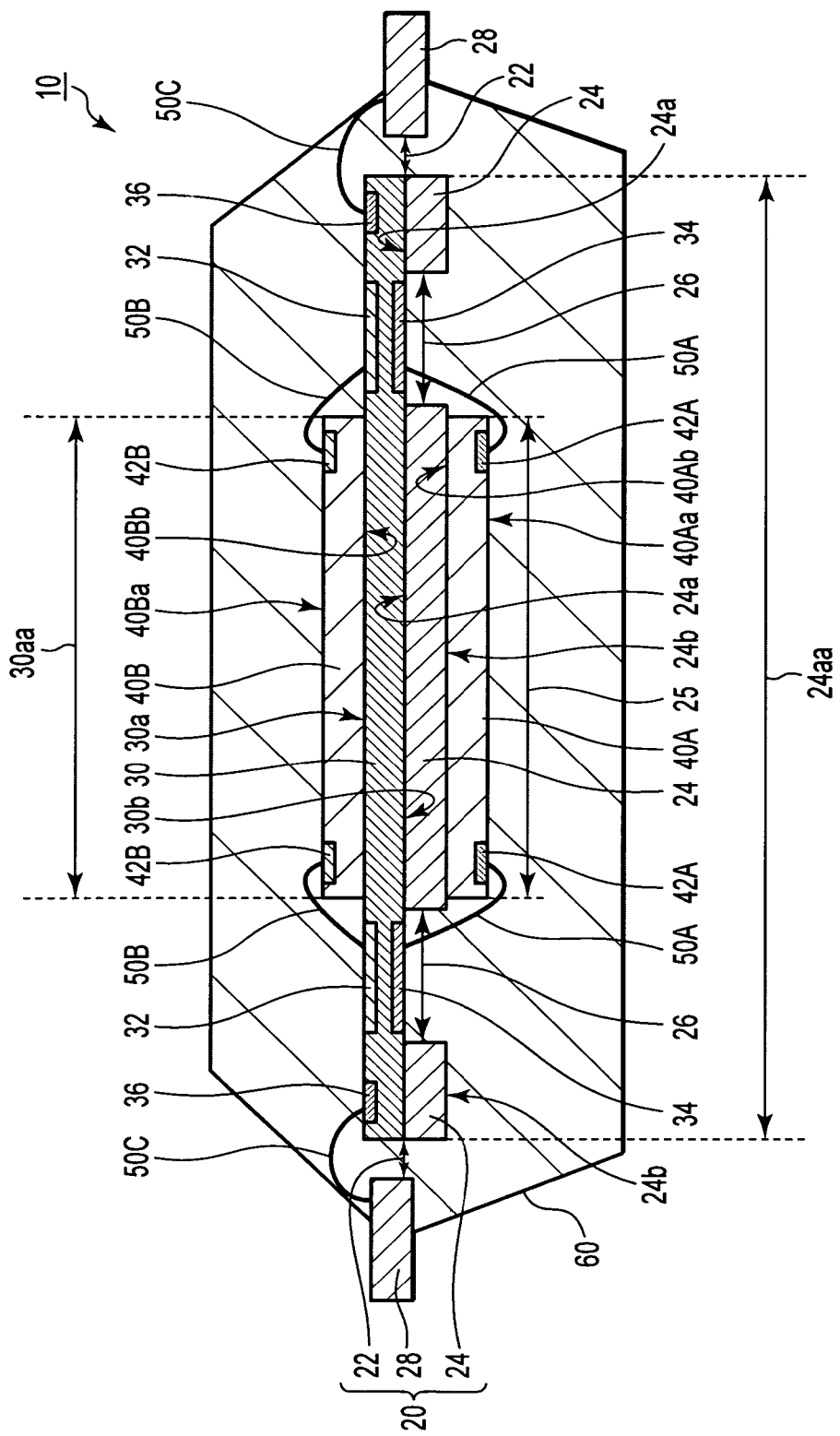
FIG. 2 is a schematic view showing a cut area taken along one-dot chain line I-I' shown in each of FIGS. 1(A) and 1(B)

FIG. 2 is a schematic view showing a cut area taken along one dot chain line I-I' shown in each of FIGS. 1(A) and 1(B).

As shown in FIGS. 1(A) and 1(B), the semiconductor device 10 of the present invention includes a base material 21, a device hole 22, leads 28 and support leads 29 to be described later all of which were parts of a lead frame before fractionalization. As the lead frame per se, there can be used one similar to the lead frame known to date, which has been formed of, for example, an arbitrary suitable material.

As shown in FIG. 2, the semiconductor device 10 includes a die pad 24 having a first main surface 24a and a second main surface 24b opposite to the first main surface 24a. A flat or planar shape of the die pad 24 is rectangular in the present example. A substrate and a semiconductor chip are mounted onto the die pad 24.

A substrate mounting area 24aa is set to the first main surface 24a of the die pad 24 in advance. A die pad-side semiconductor chip mounting area 25 is set to the second main surface 24b in advance.

The die pad 24 has one or two or more openings or apertures 26 provided within the substrate mounting area 24aa and outside the die pad-side semiconductor chip mounting area 25 so as to penetrate between the first main surface 24a and the second main surface 24b.

As is apparent from the description to be mentioned later, the openings 26 are used to expose second electrode pads 34 provided in a second main surface 30b of a substrate 30. Accordingly, each of the openings 26 may preferably be set as small in area as possible as the condition that it enables each second electrode pad 34 to be exposed.

That is, the die pad 24 of the present invention is characterized in that the area of the opening 26 is reduced to such a minimal breadth as to enable exposure of one or two or more second electrode pads 34 of the substrate 30. Thus, since the area of the die pad-side semiconductor chip mounting area 25 can be expanded by such a reduction in area, the rate of the die pad-side semiconductor chip mounting area 25 to the full area of the die pad 24 can be enlarged.

If done in this way, then a larger-scaled semiconductor chip can be mounted. Even when the large-scaled semiconductor chip is mounted, the strength of the die pad 24 can be ensured more effectively as compared with the conventional one.

A circular bonding area 27 having a width of about 2 mm even at the minimum is preset to the first main surface 24a inside the substrate mounting area 24aa, i.e., inside the contour of the first main surface 24a in the present example. The bonding area 27 is a so-called bonding or adhesion margin corresponding to an area on which a bonding or adhesive material is provided and substantially adhered when the substrate 30 is mounted thereon.

The openings 26 are provided at two places in the present example and the shape of each opening 26 is rectangular. The openings 26 are provided along the short sides of the die pad 24 each other with the substrate mounting area 24aa interposed therebetween and in such a manner that their long sides are made parallel with the corresponding short sides.

Further, the die pad 24 has the support leads 29 provided integrally. In the present example, the two strip-like support leads 29 have one ends respectively connected integrally with the central neighborhood of both short sides of the rectangle of the die pad 24 and extend linearly with respect to the direction to be spaced away from the die pad 24 over a line that connects the centers of both short sides to each other.

On the other hand, a plurality of strip-like leads 28 shown in FIGS. 1(A) and 1(B) and FIG. 2 correspond to the leads 28 included in the lead frame 20. These leads 28 function as external terminals of the semiconductor device 10.

These leads 28 are provided side by side in such a manner that in the illustrated example, flat or planar shapes thereof as viewed from their upper-surface sides are rectangular and one ends thereof are opposed to the end edges of the die pad 24. Incidentally, the shape of each lead 28 can be set to an arbitrary suitable shape according to the form of each selected lead frame, the selection of a cut position, etc.

Thus, these leads 28 are arranged by the same number on both sides of their corresponding support leads 29 in the present embodiment and provided so as to surround the die pad 24 from both sides. Incidentally, the number of the leads 28 and their layout positions can be set to arbitrary and suitable ones according to the selection of the lead frame, the substrate to be mounted and the selection of the semiconductor chip.

In the present example, the leads 28 are arranged so as to be spaced away from the two opposite short sides of the rectangular die pad 24 in the direction extending along the two short sides and to make their longitudinal directions parallel with each other.

Incidentally, each of the leads 28 has the configuration known to date, based on a conductive material such as copper or aluminum.

The semiconductor device 10 of the present invention includes the substrate 30. In the present example, the substrate 30 is of a printed wiring board. The printed wiring board is a plate-shaped member whose flat shape is rectangular. In the present example, the substrate 30 includes one or two or more wiring layers within its surface, back surface and/or thickness. The printed wiring board having the plural wiring layers has a wiring structure in which by means of a configuration using through electrodes that bury embedded vias and through holes, for example, they are electrically connected to one another.

The substrate 30 preferably has the function of converting signals inputted to, for example, various electrode pads to be described later into position form for arbitrary and suitable other electrode pads and outputting the same.

The substrate 30 has a first main surface 30a and the second main surface 30b opposite to the first main surface 30a.

A substrate-side semiconductor chip mounting area 30aa is set to the first main surface 30a in advance. Semiconductor chip connecting first electrode pads 32 are provided in an area lying outside the substrate-side semiconductor chip mounting area 30aa. The semiconductor chip connecting first electrode pads 32 are arranged in plural form, i.e. four in the present example along the short side of the substrate 30.

Further, lead-connecting electrode pads 36 are provided in the first main surface 30a. The lead-connecting electrode pads 36 are arranged in plural form, four in the present example in an area lying outside the arrangement of the semiconductor chip connecting first electrode pads 32 along the short side of the substrate 30.

On the other hand, the second main surface 30b is of a surface on which the substrate 30 is mounted in the substrate mounting area 24aa of the die pad 24. A plurality of the semiconductor chip connecting second electrode pads 34 are provided in the second main surface 30b.

Since the two openings 26 parallel to each other are provided in the die pad 24 as already described, the semiconductor chip connecting second electrode pads 34 are exposed from the openings 26 of the die pad 24 at the second main surface 30b when the substrate 30 is mounted to the die pad 24. In the present embodiment, all of the four semiconductor chip connecting second electrode pads 34 arranged in parallel with one another along the short side of the substrate 30 are mounted to be exposed to the openings 26 as one set.

The openings 26 can be set to arbitrary and suitable shapes and numbers according to the layouts of the electrode pads of the substrate 30. When, for example, the substrate 30 has a plurality of semiconductor chip connecting second electrode pads 34 arranged along only one short side, these electrode pads 34 are collectively provided and the opening 26 to be exposed may be formed as one.

Upon mounting, the die pad 24 and the substrate 30 are bonded to each other by applying an arbitrary and suitable adhesive material known to date such as an epoxy resin to the bonding area 27 of the die pad 24.

In the present example, the contour size of the substrate 30 as viewed from its upper surface side, and the contour shape and size of the die pad 24 as viewed from its upper surface side are aligned to substantially the same shape and size. That is, the contours of the die pad 24 and the substrate 30 held in the state of being mounted thereon coincide with each other except for the protruded support leads 29. Incidentally, it is not always necessary to cause the contour size of the substrate 30 as viewed from its upper surface side to coincide with the contour shape and size of the die pad 24. For example, the end edge of the substrate 30 can also take such a form as to slightly protrude from its corresponding end edge of the die pad 24 in a range that does not impair the balance of the entire package and the advantage.

Incidentally, the lead connecting electrode pads 36 can also be provided on the second main surface 30b side of the substrate 30. In this case, the openings 26 may be configured so as to expose both the semiconductor chip connecting second electrode pads 34 and the lead connecting electrode pads 36.

The semiconductor device 10 includes a first semiconductor chip 40A. The first semiconductor chip 40A is mounted on the die pad-side semiconductor chip mounting area 25 of the die pad 24.

The first semiconductor chip 40A has the shape of a rectangular parallelepiped having a surface 40Aa and a back surface 40Ab opposite to the surface 40Aa. Although the surface 40Aa and back surface 40Ab of the first semiconductor chip 40A are shown as approximately square, they are not limited to it.

The first semiconductor chip 40A is mounted in the die pad-side semiconductor chip mounting area 25 of the die pad 24 with its back surface 40Ab being opposed thereto.

The first semiconductor chip 40A has a plurality of chip electrode pads 42A provided so as to be exposed from the surface 40Aa side.

The chip electrode pads 42A are arranged in parallel with their sides along the opposite two sides respectively.

The first semiconductor chip 40A is mounted on the die pad 24 in such a manner that the sides thereof along which the chip electrode pads 42A are arranged, become approximately parallel to the arrangement of the semiconductor chip connecting second electrode pads 34 of the substrate 30, which are exposed from the openings 26 of the die pad 24.

The first semiconductor chip 40A can be configured as a semiconductor chip having an arbitrary and suitable desired function, like, preferably, for example, a flash memory chip.

The semiconductor device 10 is equipped with first bonding wires 50A. The first bonding wires 50A connect between the semiconductor chip connecting second electrode pads 34 and the chip electrode pads 42A of the first semiconductor chip 40A.

The semiconductor device 10 includes a second semiconductor chip 40B. The second semiconductor chip 40B is mounted to the substrate-side semiconductor chip mounting area 30aa interposed between the semiconductor chip connecting first electrode pads 32 of the substrate 30.

The second semiconductor chip 40B has a surface 40Ba and a back surface 40Bb opposite to the surface 40Ba and has an outside shape similar to that of the first semiconductor chip 40A.

The second semiconductor chip 40B is mounted in the substrate-side semiconductor chip mounting area 30aa with the back surface 40Bb being made opposite thereto.

The second semiconductor chip 40B has a plurality of chip electrode pads 42B. The chip electrode pads 42B are provided so as to be exposed from the surface 40Ba.

In the present example, the chip electrode pads 42B are arranged along the two opposite sides respectively.

The second semiconductor chip 40B is mounted onto the substrate 30 in such a manner that the sides thereof along which the chip electrode pads 42B are arranged, become approximately parallel to the arrangement of the semiconductor chip connecting first electrode pads 32 of the substrate 30.

The semiconductor device 10 is provided with second bonding wires 50B. The second bonding wires 50B connect between the semiconductor chip connecting first electrode pads 32 and the chip electrode pads 42B of the second semiconductor chip 40B.

The shape of the second semiconductor chip 40B may be identical to or different from that of the first semiconductor chip 40A. Further, the second semiconductor chip 40B may be identical to or different from the first semiconductor chip 40A in function.

The semiconductor device 10 is provided with third bonding wires 50C. The third bonding wires 50C connect between the lead connecting electrode pads 36 of the substrate 30 and the leads 28.

The semiconductor device 10 has a sealing or encapsulating portion 60. The sealing portion 60 covers the die pad 24, substrate 30, first semiconductor chip 40A, second semiconductor chip 40B, first bonding wires 50A, second bonding wires 50B and third bonding wires 50C and exposes parts of the leads 28.

According to the configuration of the semiconductor device of the present invention, the area of adhesion of a die pad to a substrate can be ensured because the die pad is provided with openings each having a minimal breadth, i.e., area for exposing each of electrode pads of the substrate mounted onto the die pad. Thus, even when a semiconductor chip larger in plane size is sealed, a multichip package can be obtained without scaling up the outer size of a sealing portion, i.e., the outer size of the semiconductor device.

Since the openings are provided in the die pad with the required minimum breadth, i.e., area for exposing each electrode pad only, the area that remains as for the entire die pad is greatly larger than conventional. As a result, a semiconductor chip larger in plane size can be sealed while the strength of the die pad is being maintained. Thus, the reliability of the semiconductor device can be maintained while its great functionality is being held, by the mounting of a larger-scaled high-performance semiconductor chip.

(2) Example of Semiconductor Device Manufacturing Method

An embodiment of a method for manufacturing a semiconductor device of the present invention will next be explained with reference to FIGS. 3 and 4.

Figure 3A:
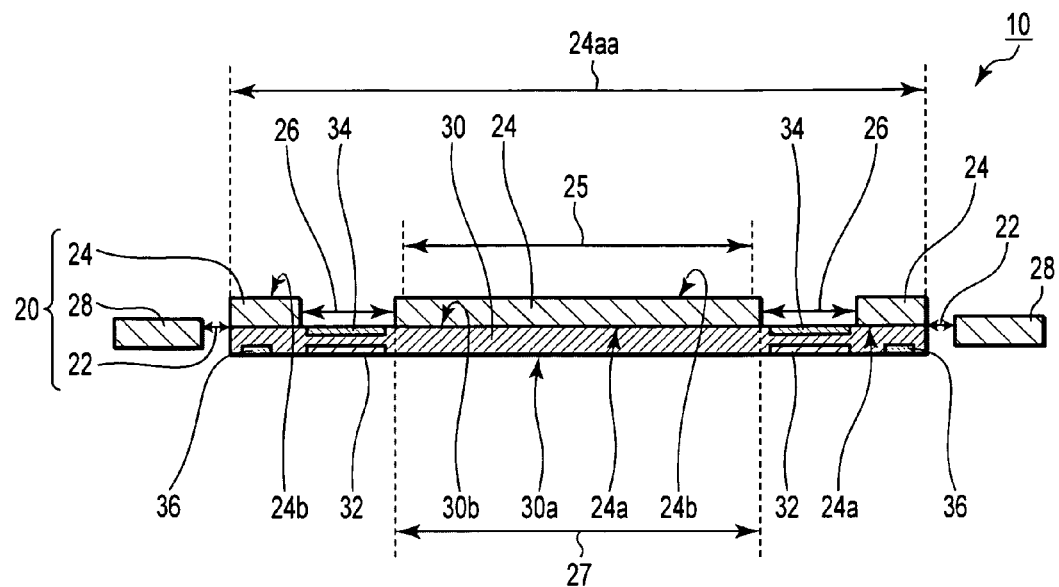
FIGS. 3(A) and 3(B) are respectively process views for describing a manufacturing method.
Figure 3B:
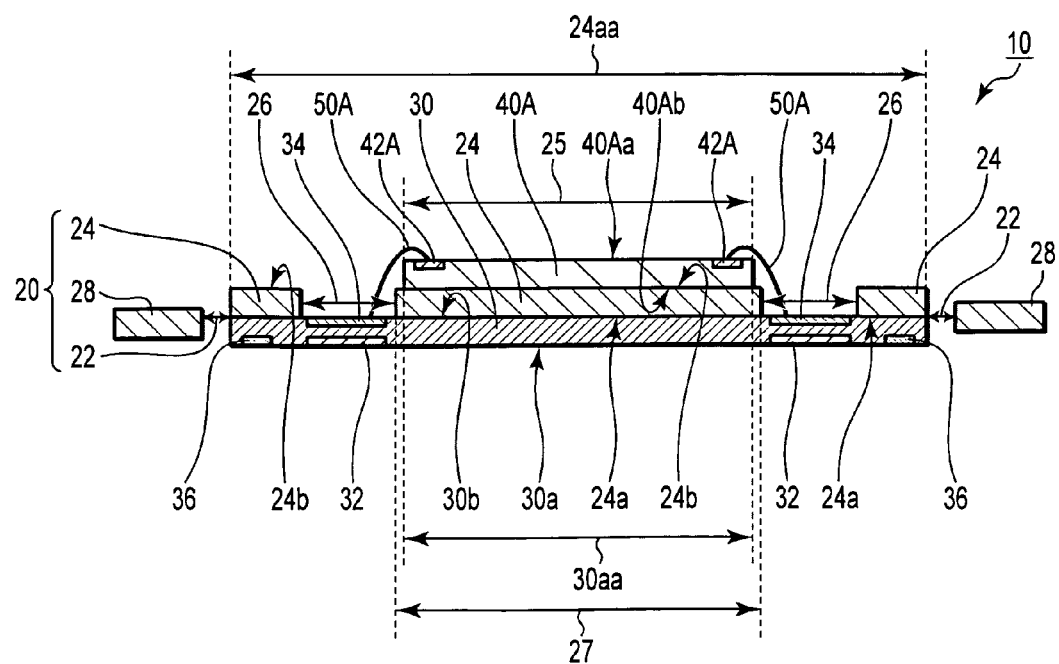

FIGS. 3(A) and 3(B) are respectively process views for describing the method for manufacturing the semiconductor device of the present invention.

Figure 4A:
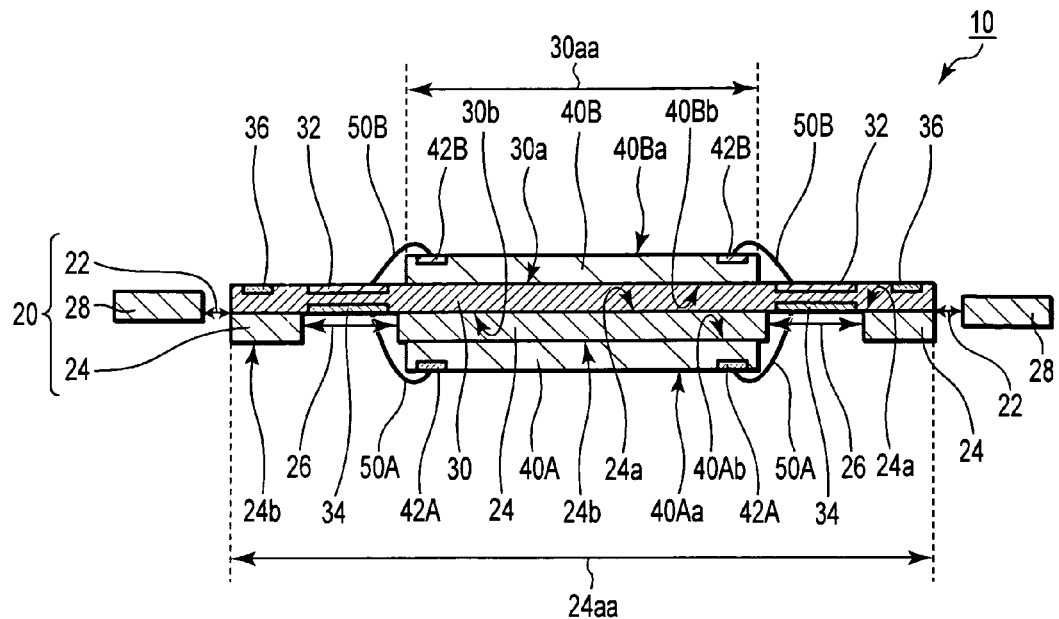
FIGS. 4(A) and 4(B) are respectively process views following FIG. 3.
Figure 4B:
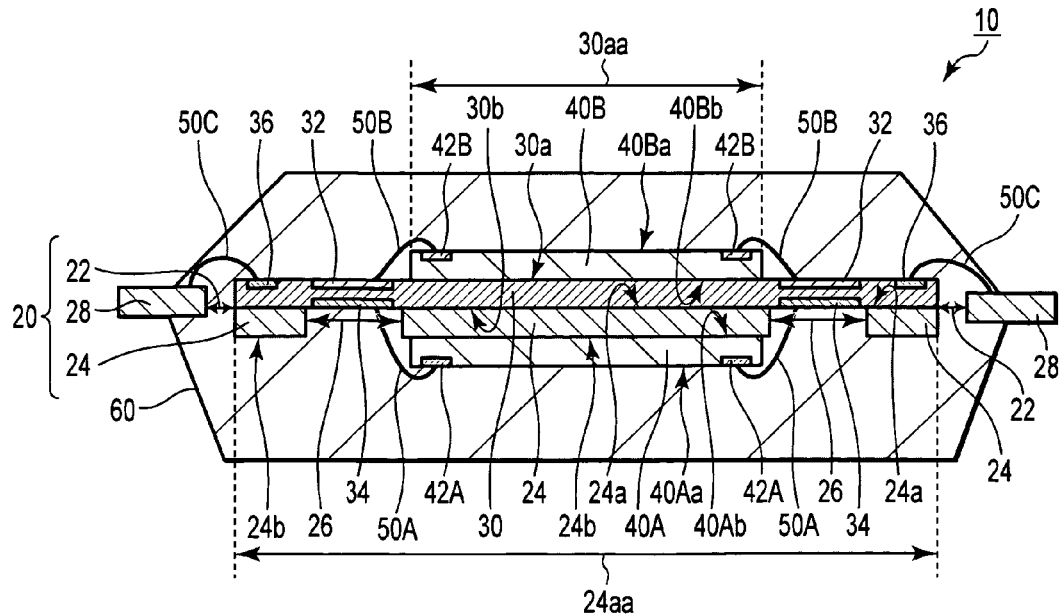

FIGS. 4(A) and 4(B) are respectively process views following FIG. 3.

A lead frame 20 is first prepared. As to the lead frame per se, various forms are available in markets.

Incidentally, the semiconductor device of the present invention is completed by being cut out from lead frames, i.e., being individualized. Since, however, the lead frame 20 prior to a fractionalizing process or process step except for the die pad 24 is no different in configuration from the conventionally used lead frame, its basic shape will be explained here in brief.

The lead frame 20 includes a longer so-called base (not shown) formed by the conventionally known arbitrary and suitable material such as copper.

The base is provided with a plurality of device holes 22 sequentially arranged along the direction in which its long side extends. The die pad 24 is suspended and supported by support leads 29 within the corresponding device hole 22.

Incidentally, although the lead frame 20 is provided with each of the device holes 22 disposed in series in the longitudinal direction of the base, a manufacturing process will be explained while one device hole 22, i.e., one die pad 24 alone is being shown.

As already described, the lead frame 20 suitable if applied to the process of manufacturing the semiconductor device of the present invention has a constructional feature in that it has the die pad 24 formed with the openings 26 in the areas other than a semiconductor chip mounting area 25.

Since the configuration example of the die pad 24 has already been described with reference to FIGS. 1(A) and 1(B) and FIG. 2, its detailed description is omitted.

As shown in FIG. 3(A), a substrate 30 is mounted onto its corresponding substrate mounting area 24aa of the die pad 24 of the lead frame 20 having the configuration already described above. This mounting step can be conducted in accordance with the method known per se using a bonding or adhesive material known to date such as an epoxy resin.

Upon adhesion, a bonding or adhesion area 27 corresponding to part of the substrate mounting area 24aa of the lead frame 20 is used as an adhesion or bonding margin. That is, the adhesion may be performed by applying the adhesive material to the bonding area 27.

As has already been described with reference to FIGS. 1(A) and 1(B) and FIG. 2, the mounted substrate 30 has a substrate-side semiconductor chip mounting area 30aa on the first main surface 30a side. In addition to it, the substrate 30 has a plurality of semiconductor chip connecting first electrode pads 32 outside the substrate-side semiconductor chip mounting are 30aa. Incidentally, the detailed description of the substrate 30 will be omitted to avoid dual explanations.

The substrate 30 having the above-described configuration is mounted on the substrate mounting area 24aa of the lead frame 20.

At this time, the substrate 30 is mounted thereon in such a manner that a plurality of semiconductor chip connecting second electrode pads 34 on the second main surface 30b side are exposed from their corresponding openings 26 of the die pad 24.

Next, as shown in FIG. 3(B), a first semiconductor chip 40A is mounted onto the die pad-side semiconductor chip mounting area 25 with its back surface 40A being opposed thereto. This step may be conducted in accordance with the method known per se in the art using a die bonding material known to date, i.e., an arbitrary and suitable bonding or adhesive material.

Further, first bonding wires 50A for connecting the semiconductor chip connecting second electrode pads 34 of the substrate 30 and chip electrode pads 42A of the first semiconductor chip 40A are provided. This step can be performed using a so-called bonding tool known to date.

Next, as shown in FIG. 4(A), a structure in manufacture process in which up to the formation of the first bonding wires 50A is finished, i.e., the lead frame 20 is turned upside down to expose the first main surface 30a of the substrate 30 with it directed upwardly.

Next, a second semiconductor chip 40B is mounted on the substrate 30. The second semiconductor chip 40B has a surface 40Ba and a back surface 40Bb opposite to the surface 40Ba. The second semiconductor chip 40B has a plurality of chip electrode pads 42B provided on the surface 40Ba side.

The second semiconductor chip 40B is mounted with back surface 40Bb of the second semiconductor chip 40B being opposed to the substrate-side semiconductor chip mounting area 30aa of the substrate 30. This step may be done in accordance with the method known per se in the art using the die bonding material known to date.

Next, second bonding wires 50B are provided in accordance with the method know per se in the art. The second bonding wires 50B connect the semiconductor chip connecting first electrode pads 32 of the substrate 30 and the chip electrode pads 42B of the second semiconductor chip 40B.

Further, third bonding wires 50C are provided in accordance with the method known per se in the art as shown in FIG. 4(B). The third bonding wires 50C connect lead connecting electrode pads 36 of the substrate 30 and leads 28 of the lead frame 20.

Next, a sealing or encapsulating portion 60 is formed in accordance with the method known per se in the art. The sealing portion 60 covers the die pad 24, substrate 30, first semiconductor chip 40A, second semiconductor chip 40B, first bonding wires 50A, second bonding wires 50B and third bonding wires 50C and is shaped in form to expose parts of the leads 28 therefrom.

The sealing portion 60 can be formed in accordance with a sealing process step known to date using a so-called encapsulating mold, using, preferably, an arbitrary and suitable material such as a mold resin, a liquid resin or the like known to date.

The sealing portion 60 can be formed by, for example, using a mold capable of defining space having a predetermined shape and predetermined capacity, i.e., a cavity, supplying a sealing resin material into the cavity and curing the same.

After the curing of the sealing portion 60, the mold is taken off and the individualizing process or process step is performed. This individualizing process step may be performed by cutting the leads 28 and support leads 29 lying within the remaining device holes 22 using a rotating blade, for example.

The leads 28 exposed from the sealing portion 60 by the individualizing process step can function as external terminals. Thus, the semiconductor device 10 is completed by being cut out from the lead frame 20.

Second Preferred Embodiment (1) Configuration Example of Semiconductor Device

A configuration example of a second embodiment showing a semiconductor device of the present invention will be explained with reference to FIG. 5.

Incidentally, since a plan view is approximately similar to FIG. 1 already described, its illustration and detailed description are omitted.

Figure 5:
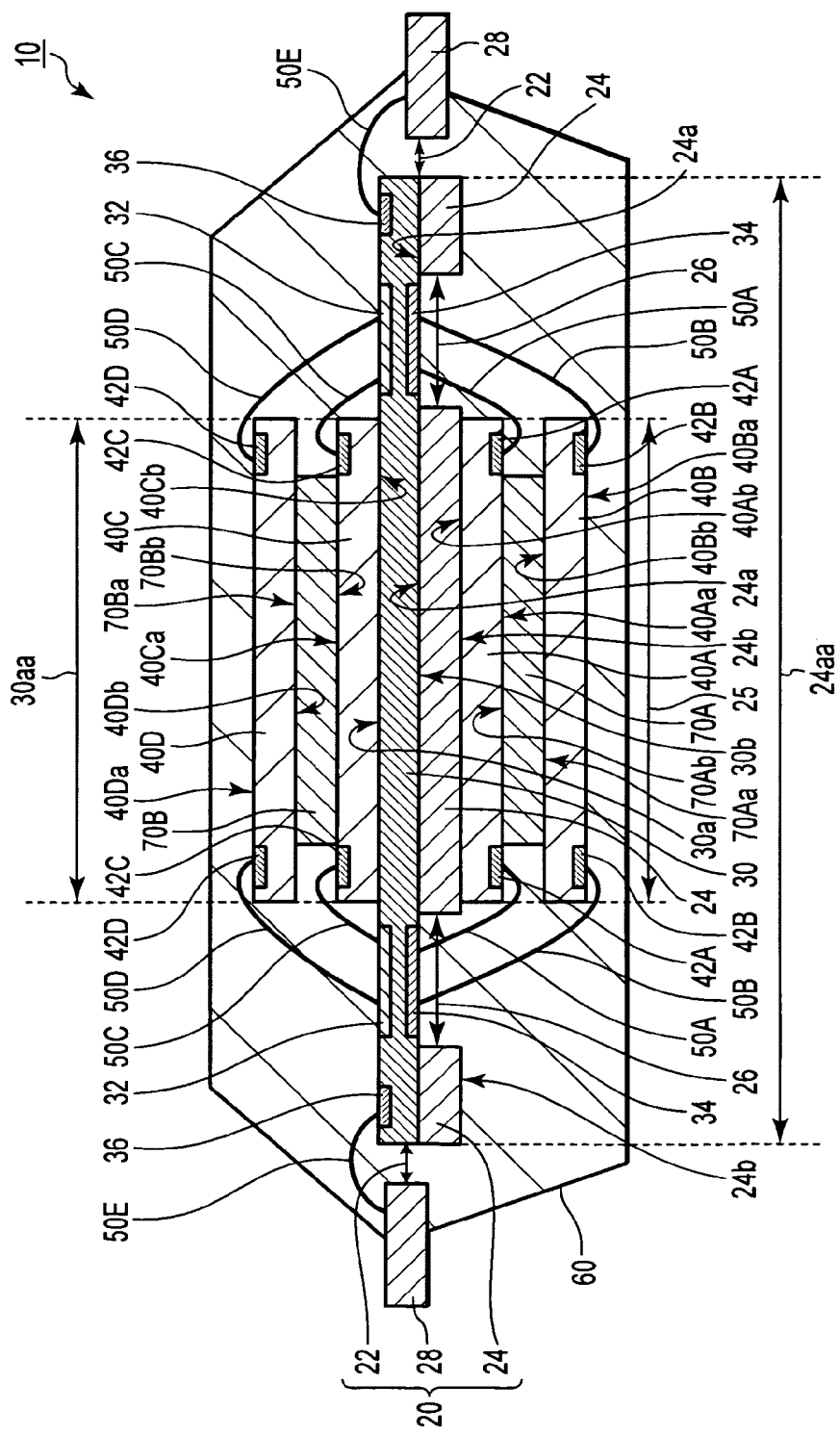
FIG. 5 is a schematic view illustrating a cut area formed by cutting a semiconductor device.

FIG. 5 is a schematic view showing a cut area obtained by cutting the semiconductor device at the same position as one dot chain line I-I' shown in each of FIGS. 1(A) and 1(B).

The semiconductor device 10 according to the second embodiment has a constructional feature in that a plurality of semiconductor chips mounted with a plurality of spacer substrates, i.e., first and second spacer substrates 70A and 70B interposed therebetween are mounted over a substrate and a die pad.

Incidentally, since constituent elements of the semiconductor device such as the die pad, i.e., lead frame 20, and the mounted substrate 30 and semiconductor chips are similar to those of the already-described first embodiment except for the spacer substrates, their detailed explanations are omitted.

As shown in FIG. 5, the semiconductor device 10 of the present invention includes the die pad 24 that has constituted part of the lead frame 20 before fractionalization.

The substrate 30 is mounted on a first main surface 24a of the die pad 24.

In the present example, the contour size of the substrate 30 as viewed from its upper surface side, and the contour size of the die pad 24 as viewed from its upper surface side are respectively aligned to the same size. That is, the contours or outlines of the die pad 24 and the substrate 30 held in the state of being mounted thereon coincide with each other except for protruded support leads 29 (refer to FIGS. 1(A) and 1(B)).

The semiconductor device 10 includes a first semiconductor chip 40A. The first semiconductor chip 40A is mounted on its corresponding die pad-side semiconductor chip mounting area 25 of the die pad 24.

The first semiconductor chip 40A is mounted in the die pad-side semiconductor chip mounting area 25 of the die pad 24 with its back surface 40Ab being opposed thereto.

The first semiconductor chip 40A is mounted on the die pad 24 in such a manner that the sides thereof along which chip electrode pads 42A are arranged, become approximately parallel to the arrangement of semiconductor chip connecting second electrode pads 34 of the substrate 30, which are exposed from openings 26 of the die pad 24.

The semiconductor device 10 is equipped with first bonding wires 50A. The first bonding wires 50A connect the semiconductor chip connecting second electrode pads 34 and the chip electrode pads 42A of the first semiconductor chip 40A.

The first spacer substrate 70A is mounted on a surface 40Aa of the first semiconductor chip 40A.

The first spacer substrate 70A is of a plate-like member having a surface 70Aa and a back surface 70Ab opposite to the surface 70Aa. The first spacer substrate 70A is mounted so as to expose the chip electrode pads 42A.

A flat or planar shape of the first spacer substrate 70A is analogous to that of the first semiconductor chip 40A. The size of the planar shape of the first spacer substrate 70A is set to an area smaller than that of the first semiconductor chip 40A to such an extent as to enable exposure of the chip electrode pads 42A.

The first spacer substrate 70A may preferably be configured as a silicon substrate, for example. Incidentally, a substrate comprised of other arbitrary and suitable material can also be used in consideration of dissipation or the like as well as the silicon substrate.

A second semiconductor chip 40B is mounted on the surface 70Aa of the first spacer substrate 70A.

The second semiconductor chip 40B is a chip of the same shape and size as the first semiconductor chip 40A in the present example. That is, the second semiconductor chip 40B has a surface 40Ba and a back surface 40Bb opposite to the surface 40Ba.

The second semiconductor chip 40B is mounted with the back surface 40Bb opposite to the surface 70Aa of the first spacer substrate 70A.

At this time, the second semiconductor chip 40B is mounted in overlapped form in such a manner that its flat or planar contour coincides with that of the first semiconductor chip 40A.

Second boding wires 50B connect the semiconductor chip connecting second electrode pads 34 exposed from the openings 26 of the die pad 24 and chip electrode pads 42B of the second semiconductor chip 40B.

Further, the semiconductor device 10 includes a third semiconductor chip 40C. The third semiconductor chip 40C is mounted in a substrate-side semiconductor chip mounting area 30aa interposed between semiconductor chip connecting first electrode pads 32 of the substrate 30.

The third semiconductor chip 40C has a surface 40Ca and a back surface 40Cb opposite to the surface 40Ca and has an outer shape similar to the first and second semiconductor chips 40A and 40B.

The third semiconductor chip 40C is mounted in the substrate-side semiconductor chip mounting area 30aa with its back surface 40Cb opposite thereto.

Third bonding wires 50C connect the semiconductor chip connecting first electrode pads 32 and chip electrode pads 42C of the third semiconductor chip 40C.

The second spacer substrate 70B having a form similar to that of the first space substrate 70A is mounted on the surface 40Ca of the third semiconductor chip 40C.

The second spacer substrate 70B is of a plate-like member having a surface 70Ba and a back surface 70Bb opposite to the surface 70Ba. The second spacer substrate 70B is mounted so as to expose the chip electrode pads 42C of the third semiconductor chip 40C.

A fourth semiconductor chip 40D is mounted on the surface 70Ba of the second spacer substrate 70B.

The fourth semiconductor chip 40D is a chip of the same shape and size as the first semiconductor chip 40A in the present example. That is, the fourth semiconductor chip 40D has a surface 40Da and a back surface 40Db opposite to the surface 40Da.

The fourth semiconductor chip 40D is mounted with the back surface 40Db opposite to the surface 70Ba of the second spacer substrate 70B.

At this time, the fourth semiconductor chip 40D is mounted in overlapped form in such a manner that its flat or planar contour coincides with that of the third semiconductor chip 40C.

Fourth bonding wires 50D connect the semiconductor chip connecting first electrode pads 32 and chip electrode pads 42D of the fourth semiconductor chip 40D.

The semiconductor device 10 is provided with fifth bonding wires 50E. The fifth bonding wires 50E connect lead connecting electrode pads 36 of the substrate 30 and leads 28.

The semiconductor device 10 has a sealing or encapsulating portion 60. The sealing portion 60 covers the die pad 24, substrate 30, first semiconductor chip 40A, second semiconductor chip 40B, third semiconductor chip 40C, fourth semiconductor chip 40D, first bonding wires 50A, second bonding wires 50B, third bonding wires 50C, fourth bonding wires 50D and fifth bonding wires 50E and exposes parts of the leads 28.

According to the configuration of the semiconductor device of the present embodiment, the area or region of adhesion of a die pad to a substrate can be ensured because the die pad is provided with openings each having a minimal breadth, i.e., area for exposing each of electrode pads of the substrate mounted onto the die pad. Thus, even when a semiconductor chip larger in plane size is sealed, a multichip package can be obtained without scaling up the outer size of a sealing portion, i.e., the outer size of the semiconductor device.

Since the openings are provided in the die pad with the required minimum breadth, i.e., area for exposing each electrode pad only, the area that remains as for the entire die pad is greatly larger than conventional. As a result, a semiconductor chip larger in plane size can be sealed while the strength of the die pad is being maintained. Thus, the reliability of the semiconductor device can be maintained while its great functionality is being held, by the mounting of a larger-scaled high-performance semiconductor chip.

Incidentally, although the present example has explained the configuration in which the plurality of semiconductor chips of the same shape and size are mounted, the present invention is not limited to it within a scope that does not impair the object of the present invention. As the mounted semiconductor chips, a plurality of arbitrary and suitable semiconductor chips selected according to any of functions, shapes and sizes different from one another or combinations thereof can be combined.

Although the example in which the four semiconductor chips are mounted has been explained in the above description, the number of the mounted semiconductor chips is a mere illustration. For example, such a configuration that the number of semiconductor chips to be mounted on a substrate is set to one alone, i.e., three semiconductor chips are mounted thereon as a whole can also be taken. Alternatively, more semiconductor chips can also be stacked on the above example in which the four semiconductor chips are mounted, via spacer substrates interposed therebetween.

(2) Example of Semiconductor Device Manufacturing Method

An embodiment of a method for manufacturing the semiconductor device shown in FIG. 5 will next be explained with reference to FIG. 6.

Figure 6A:
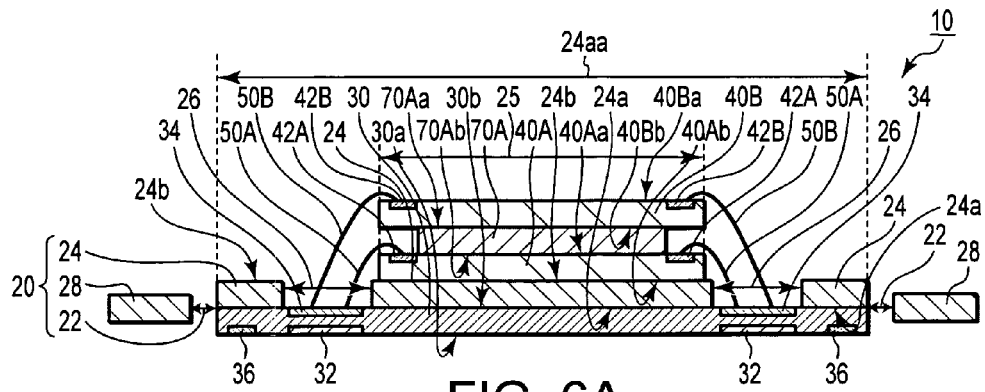
FIGS. 6(A), 6(B) and 6(C) are respectively process views for describing a manufacturing method.
Figure 6B:
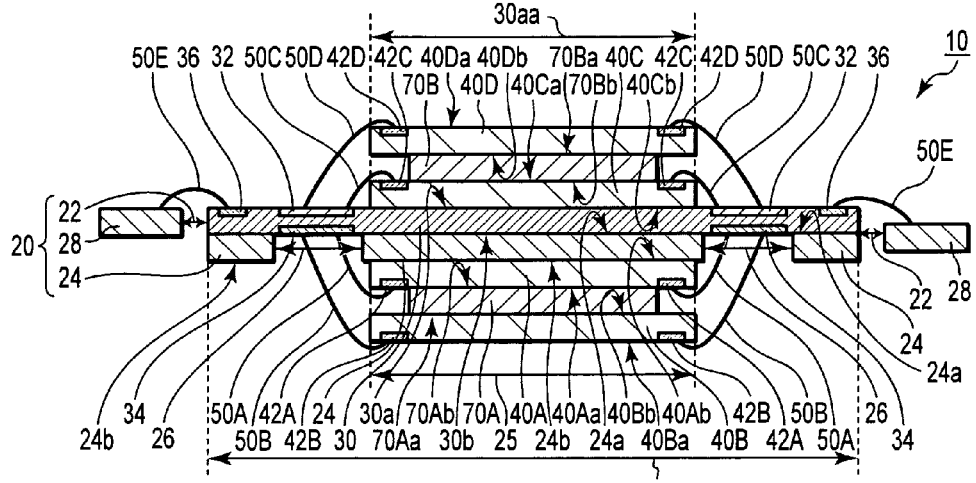
Figure 6C:
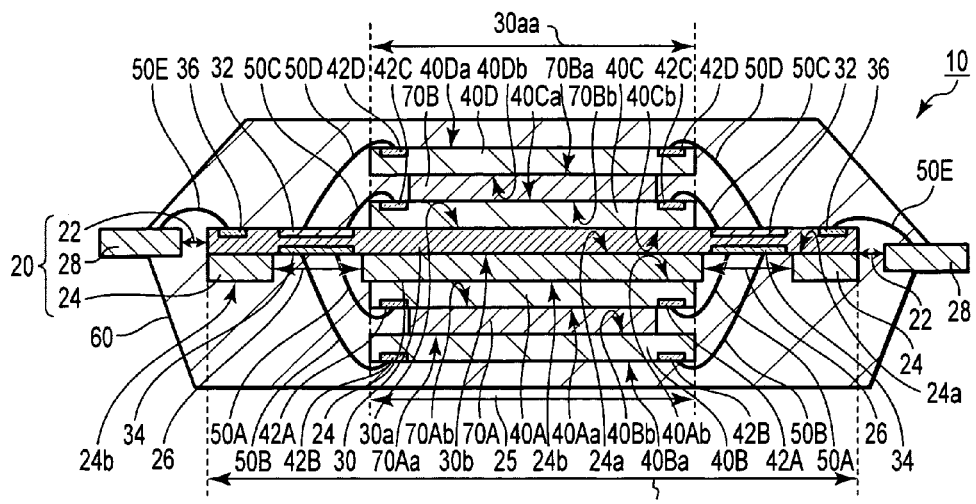

FIGS. 6(A), 6(B) and 6(C) are respectively process views for describing one example of the semiconductor device manufacturing method according to the present example.

Incidentally, since the manufacturing processes or process steps of the present example are similar up to the processes reaching the structure shown in FIG. 3(B) already described in the first embodiment, explanations up to such processes are omitted. Drawings subsequent to FIG. 6(A) will be explained as drawings following FIG. 3(B).

A lead frame 20 is first prepared. As to the lead frame per se, various forms are available in markets.

The lead frame 20 suitable if applied to the process of manufacturing the semiconductor device of the present invention has a constructional feature in that it includes a die pad 24 provided with openings 26.

The die pad 24 has a first main surface 24a and a second main surface 24b opposite to the first main surface 24a. An area on which each of a substrate and semiconductor chips is mounted, is set to the die pad 24 in advance.

A substrate mounting area 24aa is provided in the first main surface 24a of the die pad 24. A die pad-side semiconductor chip mounting area 25 is provided in the second main surface 24b.

The die pad 24 has one or two or more openings 26 provided so as to penetrate from the first main surface 24a to the second main surface 24b within the substrate mounting area 24aa and outside the die pad-side semiconductor chip mounting area 25.

A circular bonding area 27 having a width of about 2 mm even at the minimum is preset to the first main surface 24a inside the substrate mounting area 24aa, i.e., inside the contour of the first main surface 24a in the present example.

Next, as shown in FIG. 6(A), a first space substrate 70A is mounted on the surface 40Aa of the first semiconductor chip 40A shown in FIG. 3(B) with a plurality of chip electrode pads 42A of the first semiconductor chip 40A being exposed.

This step can be done in accordance with the method known per se in the art using a die bonding material such as an epoxy resin known to date.

Further, a second semiconductor chip 40B is mounted on a surface 70Aa of the first spacer substrate 70A. At this time, a back surface 40Bb of the second semiconductor chip 40B is mounted opposite to the surface 70Aa of the first spacer substrate 70A. In the present example, the second semiconductor chip 40B is mounted over the first semiconductor chip 40A in such a manner that the contour of the second semiconductor chip 40B coincides with that of the first semiconductor chip 40A in overlapped form.

This step can be performed in accordance with the method known per se in the art using the die bonding material such as the epoxy resin known to date.

Further, semiconductor chip connecting second electrode pads 34 of a substrate 30 exposed from the openings 26 and chip electrode pads 42B of the second semiconductor chip 40B are connected by second bonding wires 50B. The second bonding wires 50B can be provided in a manner similar to the first bonding wires 50A.

Next, as shown in FIG. 6(B), a structure in manufacture process in which up to the formation of the second bonding wires 50B is finished, i.e., the lead frame 20 is turned upside down to expose a first main surface 30a of the substrate 30 with it directed upward.

Next, a third semiconductor chip 40C is mounted in a substrate-side semiconductor chip mounting area 30aa of the substrate 30 in accordance with the method known per se in the art. At this time, a back surface 40Cb of the third semiconductor chip 40C is mounted opposite to the substrate-side semiconductor chip mounting area 30aa. The third semiconductor chip 40C is mounted so as to expose semiconductor chip connecting first electrode pads 32 of the substrate 30.

Further, third bonding wires 50C are provided which connect the semiconductor chip connecting first electrode pads 32 of the substrate 30 and chip electrode pads 42C of the third semiconductor chip 40C. The third bonding wires 50C can be provided by a process or process step similar to that for the other bonding wires already described.

Next, a second spacer substrate 70B is mounted on the corresponding surface 40Ca of the third semiconductor chip 40C with a back surface 70Bb of the second spacer substrate 70B opposite thereto. At this time, the second spacer substrate 70B is mounted in a manner similar to the mounting of the first spacer substrate 70A in such a manner that the chip electrode pads 42C of the third semiconductor chip 40C are exposed from the contour of the second spacer substrate 70B.

Next, a fourth semiconductor chip 40D is mounted on the corresponding surface 70Ba of the second spacer substrate 70B. At this time, the fourth semiconductor chip 40D is mounted by a process or process step similar to the mounting of other semiconductor chip with a back surface 40Db of the fourth semiconductor chip 40D being made opposite to the surface 70Ba of the second spacer substrate 70B. In the present example, the fourth semiconductor chip 40D is mounted in such a manner that the contour of the fourth semiconductor chip 40D coincides with that of the third semiconductor chip 40C in overlapped form.

Further, fourth bonding wires 50D are provided which connect the semiconductor chip connecting first electrode pads 32 of the substrate 30 and chip electrode pads 42D of the fourth semiconductor chip 40D. The fourth bonding wires 50D can be provided by a process or process step similar to that for other bonding wires already described.

Next, fifth bonding wires 50E that connect lead connecting electrode pads 36 of the substrate 30 and leads 28 of the lead frame 20, are provided by a process or process step similar to that for other bonding wires already described.

A sealing or encapsulating portion 60 is formed as shown in FIG. 6(C). The sealing portion 60 covers the die pad 24, substrate 30, first semiconductor chip 40A, second semiconductor chip 40B, third semiconductor chip 40C, fourth semiconductor chip 40D, first spacer substrate 70A, second spacer substrate 70B, first bonding wires 50A, second bonding wires 50B, third bonding wires 50C, fourth bonding wires 50D and fifth bonding wires 50E and is formed with parts of the leads 28 being exposed therefrom.

The sealing portion 60 can be formed in accordance with a sealing process step similar to the already-described first embodiment using, preferably, an arbitrary and suitable material such as a mold resin, a liquid resin or the like known to date.

An individualizing process step is finally performed. The individualizing process step may be performed by cutting the leads 28 and support leads 29 lying within the remaining device holes 22 using a rotating blade, for example.

The leads 28 exposed from the sealing portion 60 by the individualizing process step can function as external terminals. Thus, the semiconductor device 10 is completed by being cut out from the lead frame 20.

(3) Configuration of Modification

A modification of the semiconductor device according to the second embodiment will be explained with reference to FIG. 7.

Incidentally, since a plan view is nearly similar to FIG. 1 already described, its illustration and detailed explanations are omitted.

Figure 7:
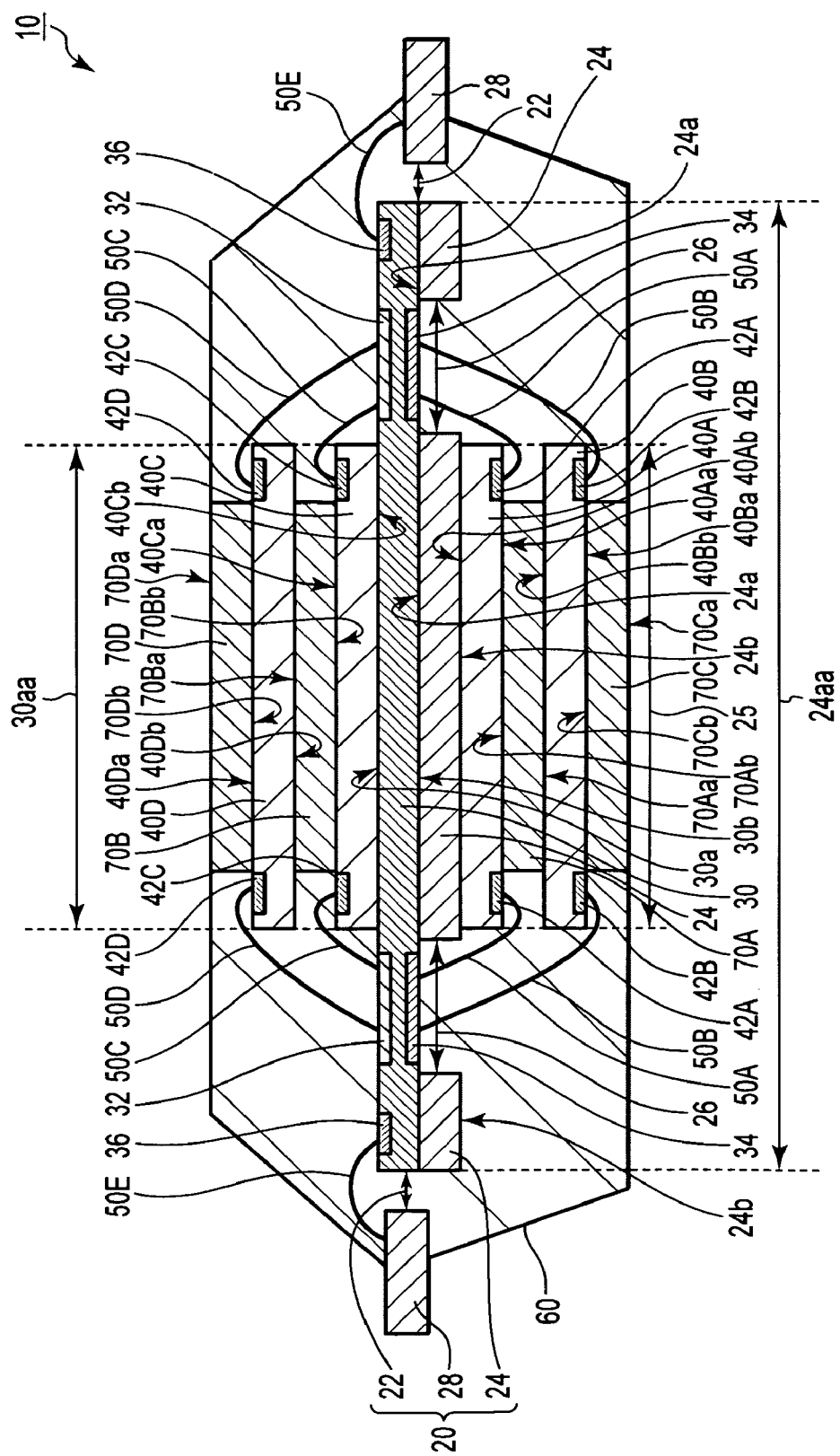
FIG. 7 is a schematic view showing a cut area formed by cutting a semiconductor device.

FIG. 7 is a schematic view showing a cut area obtained by cutting the semiconductor device at the same position as one dot chain line I-I' shown in each of FIGS. 1(A) and 1(B).

The semiconductor device 10 of the present example has a constructional feature in that further spacer substrates are mounted on the outermost semiconductor chips mounted on a substrate 30 and a die pad 24, and the surfaces of the outermost spacer substrates are exposed from a sealing portion 60.

Since a configuration other than these outermost spacer substrates is no different from the configuration example of the semiconductor device of the second embodiment already described, the same reference numerals are attached to constituent elements common to those in the second embodiment, and their detailed explanations are therefore omitted.

As shown in FIG. 7, the semiconductor device 10 is provided with a third spacer substrate 70C. That is, in the present example, the third spacer substrate 70C identical in shape to the first spacer substrate 70A is provided on its corresponding surface 40Ba of a second semiconductor chip 40B so as to overlap with the contour of a first spacer substrate 70A with a plurality of chip electrode pads 42B of the second semiconductor chip 40B being exposed.

The semiconductor device 10 further includes a fourth spacer substrate 70D. That is, in the present example, the fourth spacer substrate 70D identical in shape to a second spacer substrate 70B is provided on its corresponding surface 40Da of a fourth semiconductor chip 40D so as to overlap with the contour of the second spacer substrate 70B with a plurality of chip electrode pads 42D of the fourth semiconductor chip 40D being exposed.

A sealing portion 60 employed in the present example is provided so as to expose the full or entire surface of a surface 70Ca of the third spacer substrate 70C and the full surface of a surface 70Da of the fourth spacer substrate 70D.

Thus, if such a configuration that the surface of the spacer substrate corresponding to the uppermost layer is exposed from the sealing portion is taken, then the surface of the spacer substrate is exposed to an external environment, i.e., the atmosphere. Consequently, heat generated at each semiconductor chip and the substrate during operation is transferred through each spacer substrate, thereby making it possible to dissipate the heat into the external environment more efficiently. As a result, the operation of the semiconductor device, i.e., its electrical characteristics can be made stabler because of satisfactory heat dissipation characteristics thereof. Since higher-performance semiconductor chips can be adopted though the generated heat is large, the performance of the entire semiconductor device can be further improved.

Any of these first spacer substrate 70A, second spacer substrate 70B, third spacer substrate 70C and fourth spacer substrate 70D may preferably be configured as, preferably, for example, a silicon substrate in terms of thermal conductivity and heat dissipation characteristics.

(4) Manufacturing Method of Modification

A method for manufacturing the semiconductor device according to the present example will next be described with reference to FIG. 8.

Figure 8A:
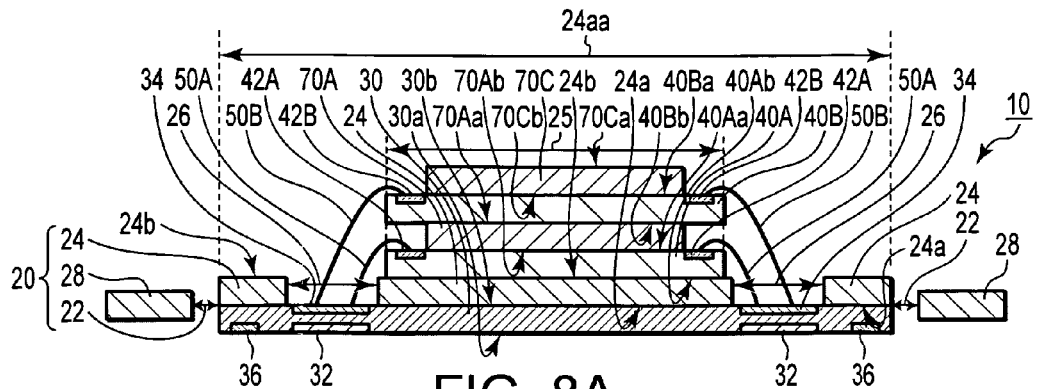
FIGS. 8(A), 8(B) and 8(C) are respectively process views for describing a manufacturing method.
Figure 8B:
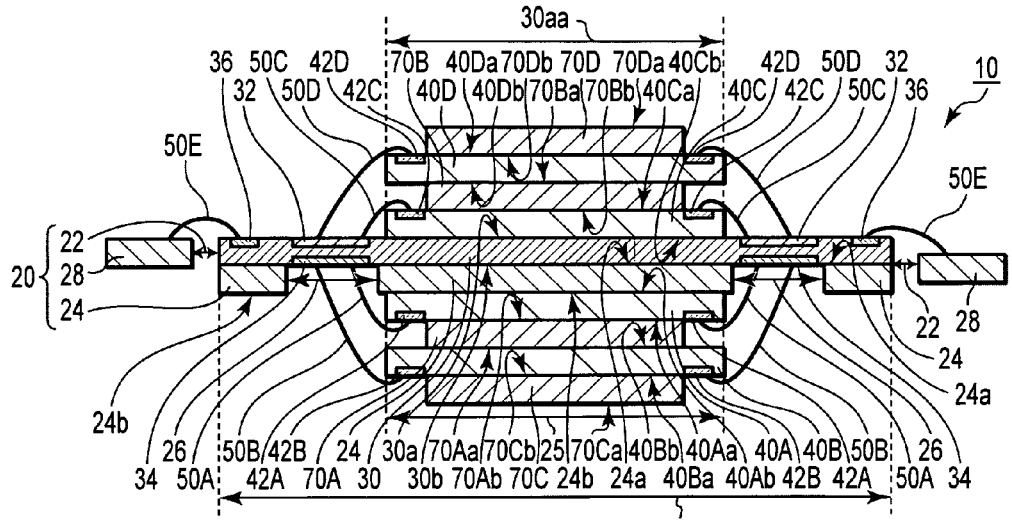
Figure 8C:
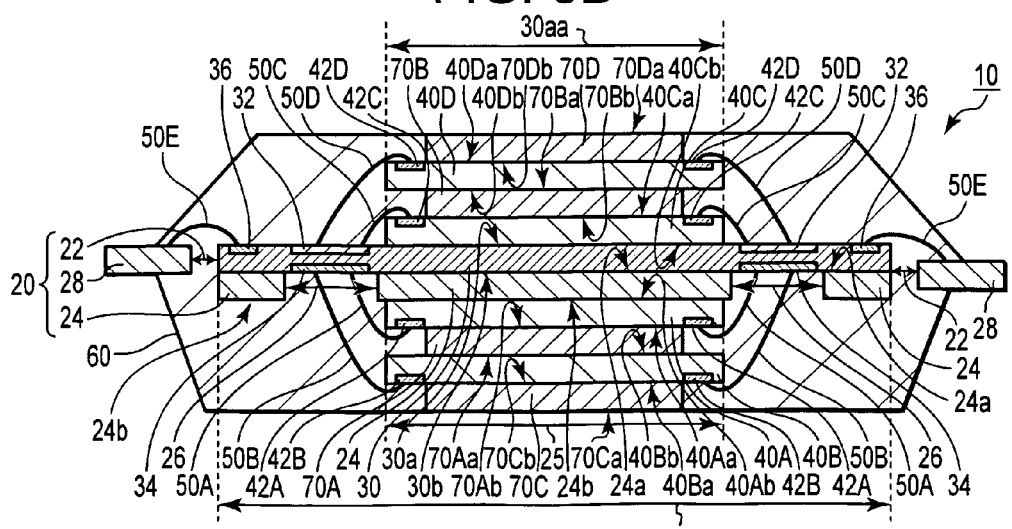

FIGS. 8(A), 8(B) and 8(C) are respectively process views for describing the method of manufacturing the semiconductor device according to the present example.

Since respective processes or process steps executed in the manufacturing method according to the present example are no different from those of the already-described second embodiment, their detailed explanations are omitted.

Incidentally, since the manufacturing processes of the present example are similar up to the processes reaching the structure shown in FIG. 6(A) already described in the second embodiment, drawings subsequent to FIG. 8(A) will be explained as drawings following FIG. 6(A).

As shown in FIG. 8(A), a third spacer substrate 70C is further mounted after the mounting of a second semiconductor chip 40B.

That is, the third spacer substrate 70C is mounted on its corresponding surface 40Ba of the second semiconductor chip 40B in accordance with a process similar to other spacer substrate with a back surface 70Cb of the third spacer substrate 70C being opposed thereto.

In the present example, the third spacer substrate 70C identical in shape to a first spacer substrate 70A is mounted so as to overlap with the contour of the first spacer substrate 70A located therebelow and expose a plurality of chip electrode pads 42B of the second semiconductor chip 40B.

Next, as shown in FIG. 8(B), a structure in manufacture process, i.e., a lead frame 20 is turned upside down to expose a first main surface 30a of a substrate 30 with being directed upward.

Next, a third semiconductor chip 40C is mounted in a substrate-side semiconductor chip mounting area 25 of the substrate 30 in accordance with the method known per se in the art.

Further, third boding wires 50C that connect semiconductor chip connecting first electrode pads 32 of the substrate 30 and chip electrode pads 42C of the third semiconductor chip 40C are provided.

Next, a back surface 70Bb of a second spacer substrate 70B is mounted on its corresponding surface 40Ca of the third semiconductor chip 40C with being opposed thereto.

Next, a fourth semiconductor chip 40D is mounted on its corresponding surface 70Ba of the second spacer substrate 70B.

Further, fourth bonding wires 50D are provided which connect the semiconductor chip connecting first electrode pads 32 of the substrate 30 and chip electrode pads 42D of the fourth semiconductor chip 40D.

Next, fifth bonding wires 50E that connect lead connecting electrode pads 36 of the substrate 30 and leads 28 of the lead frame 20 are provided by a process or process step similar to that for other bonding wires already described.

Next, a fourth spacer substrate 70D is mounted on the fourth semiconductor chip 40D by a process or process step similar to the mounting of other spacer substrates. That is, in the present embodiment, the fourth spacer substrate 70D identical in shape to the second spacer substrate 70B is mounted on its corresponding surface 40Da of the fourth semiconductor chip 40D so as to overlap with the contour of the second spacer substrate 70B with a plurality of chip electrode pads 42D of the fourth semiconductor chip 40D being exposed.

As shown in FIG. 8(C), a sealing or encapsulating portion 60 is formed as shown in FIG. 8(C). The sealing portion 60 covers the die pad 24, substrate 30, first semiconductor chip 40A, second semiconductor chip 40B, third semiconductor chip 40C, fourth semiconductor chip 40D, first spacer substrate 70A, second spacer substrate 70B, first bonding wires 50A, second bonding wires 50B, third bonding wires 50C, fourth bonding wires 50D and fifth bonding wires 50E and is formed with parts of the leads 28 being exposed therefrom.

At this time, the sealing portion 60 is formed in accordance with the already-described sealing process or process step in such a manner that the full surface of a surface 70Ca of the third spacer substrate 70C and the full surface of a surface 70Da of the fourth spacer substrate 70D are exposed.

An individualizing process step is finally performed. The individualizing process step may be performed by cutting the leads 28 and support leads 29 lying within the remaining device holes 22 using a rotating blade, for example.

The leads 28 exposed from the sealing portion 60 by the individualizing process step can function as external terminals. Thus, the semiconductor device 10 is completed by being cut out from the lead frame 20.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device comprising:
a lead frame including a die pad having a first main surface to which a substrate mounting area is set and a second main surface to which a die pad-side semiconductor chip mounting area is set, said die pad having one or two or more openings provided to penetrate between the first main surface and the second main surface within the substrate mounting area and outside the die pad-side semiconductor chip mounting area;
a substrate having a first main surface to which a substrate-side semiconductor chip mounting area is set and which is provided with a plurality of semiconductor chip connecting first electrode pads outside the substrate-side semiconductor chip mounting area, and a second main surface mounted opposite to the substrate mounting area of the lead frame and provided with a plurality of semiconductor chip connecting second electrode pads exposed from the openings of the die pad;
a first semiconductor chip which has a surface and a back surface opposite to the surface and is mounted in the die pad-side semiconductor chip mounting area with the back surface being opposed thereto; and
a second semiconductor chip which has a surface and a back surface opposite to the surface and is mounted in the substrate-side semiconductor chip mounting area with the back surface being opposed thereto.

2. The semiconductor device according to claim 1, wherein the openings are provided with minimum areas and numbers so as to expose the semiconductor chip connecting second electrode pads provided in the substrate mounted in the substrate mounting area.

3. The semiconductor device according to claim 1, wherein in the die pad, the areas of the openings are respectively reduced to a minimum breadth that makes it possible to expose the semiconductor chip connecting second electrode pads of the substrate, and the area of the die pad-side semiconductor chip mounting area is expanded by the reduction in the area thereby to enlarge a rate of the die pad-side semiconductor chip mounting area to a full area of the die pad.

4. A semiconductor device comprising:
- a lead frame which includes a die pad having a first main surface to which a substrate mounting area is set and a second main surface opposite to the first main surface and to which a die pad-side semiconductor chip mounting area is set, and having one or two or more openings provided to penetrate between the first main surface and the second main surface within the substrate mounting area and outside the die pad-side semiconductor chip mounting area, and which includes a plurality of leads that extend in a direction in which one ends thereof are directed toward end edges of the die pad and that are provided so as to surround the die pad;
- a substrate having a first main surface to which a substrate-side semiconductor chip mounting area is set and which is provided with a plurality of semiconductor chip connecting first electrode pads outside the substrate-side semiconductor chip mounting area, and a second main surface which is opposite to the first main surface and mounted opposite to the substrate mounting area of the lead frame and which is provided with a plurality of semiconductor chip connecting second electrode pads exposed from the openings of the die pad, said substrate having a plurality of lead connecting electrode pads provided in the first main surface outside the substrate-side semiconductor chip mounting area;
- a first semiconductor chip which has a surface and a back surface opposite to the surface and which is mounted in the die pad-side semiconductor chip mounting area with the back surface being opposed thereto and has a plurality of chip electrode pads provided on the surface side;
- first bonding wires which connect the semiconductor chip connecting second electrode pads and the chip electrode pads of the first semiconductor chip respectively;
- a second semiconductor chip which has a surface and a back surface opposite to the surface and which is mounted in the substrate-side semiconductor chip mounting area with the back surface being opposed thereto and has a plurality of chip electrode pads provided on the surface side;
- second bonding wires which connect the semiconductor chip connecting first electrode pads and the chip electrode pads of the second semiconductor chip respectively;
- third bonding wires which connect the lead connecting electrode pads and the leads respectively; and
- a sealing portion which covers the die pad, the substrate, the first semiconductor chip, the second semiconductor chip, the first bonding wires, the second bonding wires and the third bonding wires and are provided so as to expose parts of the leads.

5. A semiconductor device comprising:
- a lead frame which includes a die pad having a first main surface to which a substrate mounting area is set and a second main surface opposite to the first main surface and to which a die pad-side semiconductor chip mounting area is set, and having one or two or more openings provided to penetrate between the first main surface and the second main surface within the substrate mounting area and outside the die pad-side semiconductor chip mounting area, and which includes a plurality of leads that extend in a direction in which one ends thereof are directed toward end edges of the die pad and that are provided so as to surround the die pad;
- a substrate having a first main surface to which a substrate-side semiconductor chip mounting area is set and which is provided with a plurality of semiconductor chip connecting first electrode pads outside the substrate-side semiconductor chip mounting area, and a second main surface which is opposite to the first main surface and mounted opposite to the substrate mounting area of the lead frame and which is provided with a plurality of semiconductor chip connecting second electrode pads exposed from the openings of the die pad, said substrate having a plurality of lead connecting electrode pads provided in the first main surface;
- a first semiconductor chip which has a surface and a back surface opposite to the surface, and which is mounted in the die pad-side semiconductor chip mounting area with the back surface being opposed thereto and has a plurality of chip electrode pads provided on the surface side;
- first bonding wires which connect the semiconductor chip connecting second electrode pads and the chip electrode pads of the first semiconductor chip respectively;
- a first spacer substrate provided over the surface of the first semiconductor chip so as to expose the chip electrode pads of the first semiconductor chip;
- a second semiconductor chip which has a surface and a back surface opposite to the surface and which is mounted over the first spacer substrate with the back surface being opposed thereto and has a plurality of chip electrode pads provided on the surface side;
- second bonding wires which connect the semiconductor chip connecting second electrode pads and the chip electrode pads of the second semiconductor chip respectively;
- a third semiconductor chip which has a surface and a back surface opposite to the surface and which is mounted in the substrate-side semiconductor chip mounting area with the back surface being opposed thereto and has a plurality of chip electrode pads provided on the surface side;
- third bonding wires which connect the semiconductor chip connecting first electrode pads and the chip electrode pads of the third semiconductor chip respectively;
- a second spacer substrate provided over the surface of the third semiconductor chip so as to expose the chip electrode pads of the third semiconductor chip;
- a fourth semiconductor chip which has a surface and a back surface opposite to the surface and which is mounted over the second spacer substrate with the back surface being opposed thereto and has a plurality of chip electrode pads provided on the surface side;
- fourth bonding wires which connect the semiconductor chip connecting first electrode pads and the chip electrode pads of the fourth semiconductor chip respectively;
- fifth bonding wires which connect the lead connecting electrode pads and the leads respectively;
- a sealing portion which covers the die pad, the substrate, the first semiconductor chip, the second semiconductor chip, the third semiconductor chip, the fourth semiconductor chip, the first spacer substrate, the second spacer substrate, the first bonding wires, the second bonding wires, the third bonding wires, the fourth bonding wires and the fifth bonding wires and are provided so as to expose parts of the leads.

6. The semiconductor device according to claim 5, further including a third spacer substrate provided over the surface of the second semiconductor chip so as to expose the chip electrode pads of the second semiconductor chip, and a fourth spacer substrate provided over the surface of the fourth semiconductor chip so as to expose the chip electrode pads of the fourth semiconductor chip, wherein the sealing portion is provided so as to expose a surface of the third spacer substrate and a surface of the fourth spacer substrate.

7. The semiconductor device according to claim 6, wherein any of the first spacer substrate, the second spacer substrate, the third spacer substrate and the fourth spacer substrate is a silicon substrate.

8. A method for manufacturing a semiconductor device, comprising:

preparing a lead frame including a base material provided with a device hole; a die pad which is suspended by support leads within the device hole and has a first main surface to which a substrate mounting area is set and a second main surface opposite to the first main surface and to which a die pad-side semiconductor chip mounting area is set, and which has one or two or more openings provided to penetrate between the first main surface and the second main surface within the substrate mounting area and outside the die pad-side semiconductor chip mounting area; and a plurality of leads which protrude within the device hole in a direction in which one ends thereof are directed toward edge edges of the die pad and which are provided such that other ends thereof extend over the base material;

mounting, in the substrate mounting area of the lead frame, a substrate including a first main surface to which a substrate-side semiconductor chip mounting area is set and which is provided with a plurality of semiconductor chip connecting first electrode pads outside the substrate-side semiconductor chip mounting area and a second main surface opposite to the first main surface and provided with a plurality of semiconductor chip connecting second electrode pads, and including a plurality of lead connecting electrode pads provided in the first main surface outside the substrate-side semiconductor chip mounting area, in such a manner that the semiconductor chip connecting second electrode pads are exposed from the openings of the die pad;

mounting a first semiconductor chip having a surface and a back surface opposite to the surface and having a plurality of chip electrode pads provided on the surface side with the back surface being opposed to the die pad-side semiconductor chip mounting area;

providing first bonding wires which connect the semiconductor chip connecting second electrode pads and the chip electrode pads of the first semiconductor chip;

mounting a second semiconductor chip having a surface and a back surface opposite to the surface and having a plurality of chip electrode pads provided on the surface side with the back surface being opposed to the substrate-side semiconductor chip mounting area;

providing second bonding wires which connect the semiconductor chip connecting first electrode pads and the chip electrode pads of the second semiconductor chip;

providing third bonding wires which connect the lead connecting electrode pads and the leads;

forming a sealing portion which covers the die pad, the substrate, the first semiconductor chip, the second semiconductor chip, the first bonding wires, the second bonding wires and the third bonding wires and exposes parts of the leads; and cutting the leads and the support leads lying within the device hole to provide individualization.

9. A method for manufacturing a semiconductor device, comprising:

preparing a lead frame including a base material provided with a device hole; a die pad which is suspended by support leads within the device hole and has a first main surface to which a substrate mounting area is set and a second main surface opposite to the first main surface and to which a die pad-side semiconductor chip mounting area is set, and which has one or two or more openings provided to penetrate between the first main surface and the second main surface within the substrate mounting area and outside the die pad-side semiconductor chip mounting area; and a plurality of leads which protrude within the device hole in a direction in which one ends thereof are directed toward edge edges of the die pad and which are provided such that other ends thereof extend over the base material;

mounting, in the substrate mounting area of the lead frame, a substrate including a first main surface having a substrate-side semiconductor chip mounting area and provided with a plurality of semiconductor chip connecting first electrode pads outside the substrate-side semiconductor chip mounting area and a second main surface provided with a plurality of semiconductor chip connecting second electrode pads in an opposing relationship to the first main surface, and including a plurality of lead connecting electrode pads provided in the first main surface, in such a manner that the semiconductor chip connecting second electrode pads are exposed from the openings of the die pad;

mounting a first semiconductor chip having a surface and a back surface opposite to the surface and having a plurality of chip electrode pads provided on the surface side with the back surface being opposed to the die pad-side semiconductor chip mounting area;

providing first bonding wires which connect the semiconductor chip connecting second electrode pads and the chip electrode pads of the first semiconductor chip respectively;

mounting a first spacer substrate over the surface of the first semiconductor chip so as to expose the chip electrode pads of the first semiconductor chip;

mounting a second semiconductor chip having a surface and a back surface opposite to the surface and having a plurality of chip electrode pads provided on the surface side, over the first spacer substrate with the back surface being opposed thereto;

providing second bonding wires which connect the semiconductor chip connecting second electrode pads and the chip electrode pads of the second semiconductor chip respectively;

mounting a third semiconductor chip having a surface and a back surface opposite to the surface and having a plurality of chip electrode pads provided on the surface side in the substrate-side semiconductor chip mounting area with the back surface being opposed thereto;

providing third bonding wires which connect the semiconductor chip connecting first electrode pads and the chip electrode pads of the third semiconductor chip respectively;

mounting a second spacer substrate over the surface of the third semiconductor chip so as to expose the chip electrode pads of the third semiconductor chip;

mounting a fourth semiconductor chip having a surface and a back surface opposite to the surface and having a plurality of chip electrode pads provided on the surface side over the second spacer substrate with the back surface being opposed thereto;

providing fourth bonding wires which connect the semiconductor chip connecting first electrode pads and the chip electrode pads of the fourth semiconductor chip respectively;

providing fifth bonding wires which connect the lead connecting electrode pads and the leads respectively;

forming a sealing portion which covers the die pad, the substrate, the first semiconductor chip, the second semiconductor chip, the third semiconductor chip, the fourth semiconductor chip, the first spacer substrate, the second spacer substrate, the first bonding wires, the second bonding wires, the third bonding wires, the fourth bonding wires and the fifth bonding wires and exposes parts of the leads; and cutting the leads and the support leads lying within the device hole to provide individualization.

10. The method according to claim 9, further comprising:

mounting a third spacer substrate over the surface of the second semiconductor chip so as to expose the chip electrode pads of the second semiconductor chip, and mounting a fourth spacer substrate over the surface of the fourth semiconductor chip so as to expose the chip electrode pads of the fourth semiconductor chip, wherein the sealing portion forming step is a step for forming a sealing portion which exposes the surface of the third spacer substrate and the surface of the fourth spacer substrate.

11. lead frame comprising a die pad having a first main surface provided with a substrate mounting area and a second main surface opposite to the first main surface and provided with a die pad-side semiconductor chip mounting area, and having one or two or more openings provided to penetrate between the first main surface and the second main surface within the substrate mounting area and outside the die pad-side semiconductor chip mounting area; and wherein the openings are provided with minimum areas and numbers so as to only expose a plurality of semiconductor chip connecting second electrode pads provided in a substrate mounted in the substrate mounting area.

12. The lead frame according to claim 11, wherein in the die pad, the areas of the openings are respectively reduced to a minimum breadth that makes it possible to expose the semiconductor chip connecting second electrode pads of the substrate, and the area of the die pad-side semiconductor chip mounting area is expanded by the reduction in the area thereby to enlarge a rate of the die pad-side semiconductor chip mounting area to a full area of the die pad.

* * * * *